United States Patent
Li et al.

(10) Patent No.: US 11,579,274 B2
(45) Date of Patent: Feb. 14, 2023

(54) ULTRASONIC SENSING MODULE, ULTRASONIC SENSING DEVICE AND CONTROL METHOD THEREOF, DISPLAY DEVICE

(71) Applicant: BOE TECHNOLOGY GROUP CO., LTD., Beijing (CN)

(72) Inventors: Xiufeng Li, Beijing (CN); Yingming Liu, Beijing (CN); Haisheng Wang, Beijing (CN); Xiaoliang Ding, Beijing (CN); Pengpeng Wang, Beijing (CN); Yuzhen Guo, Beijing (CN); Lijun Zhao, Beijing (CN); Chenyang Zhang, Beijing (CN); Yaqian Ji, Beijing (CN); Yanling Han, Beijing (CN); Peixiao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 377 days.

(21) Appl. No.: 16/832,786

(22) Filed: Mar. 27, 2020

(65) Prior Publication Data

US 2021/0156977 A1 May 27, 2021

(30) Foreign Application Priority Data

Nov. 25, 2019 (CN) .......................... 201911168429.0

(51) Int. Cl.
*G01S 7/52* (2006.01)
*B06B 1/06* (2006.01)
(Continued)

(52) U.S. Cl.
CPC ........ *G01S 7/52079* (2013.01); *B06B 1/0207* (2013.01); *B06B 1/0644* (2013.01);
(Continued)

(58) Field of Classification Search
CPC .. G01S 15/88; G01S 7/52079; G01S 7/52025; G01S 15/8925; G01S 7/52053;
(Continued)

(56) References Cited

U.S. PATENT DOCUMENTS

2002/0180843 A1* 12/2002 Irie ..................... H01L 41/0815
347/70
2007/0170851 A1* 7/2007 Yaegashi ............. H01L 27/3281
313/506
(Continued)

FOREIGN PATENT DOCUMENTS

CN 107229909 A * 10/2017 ........... G06K 9/0002

OTHER PUBLICATIONS

H. Tang et al., Pulse-Echo Ultrasonic Fingerprint Sensor on a Chip, Transducers 2015, Jun. 21-25, 2015, 4 pages, 2015 IEEE, Alaska, USA.

*Primary Examiner* — Daniel L Murphy
*Assistant Examiner* — Amie M Ndure
(74) *Attorney, Agent, or Firm* — Collard & Roe, P.C.

(57) ABSTRACT

An ultrasonic sensing module, an ultrasonic sensing device and a control method thereof, and a display device. The ultrasonic sensing module includes a first electrode layer, a piezoelectric layer, a receiving electrode layer and an emission electrode layer. The first electrode layer is on a first side of the piezoelectric layer; the receiving electrode layer and the emission electrode layer insulated from the receiving electrode layer are on a second side of the piezoelectric layer; and the second side is opposite to the first side.

16 Claims, 8 Drawing Sheets

(51) Int. Cl.
*B06B 1/02* (2006.01)
*H01L 41/113* (2006.01)
*H01L 41/047* (2006.01)
*H01L 41/18* (2006.01)

(52) U.S. Cl.
CPC ...... *G01S 7/52053* (2013.01); *H01L 41/0471* (2013.01); *H01L 41/0472* (2013.01); *H01L 41/1132* (2013.01); *H01L 41/18* (2013.01)

(58) Field of Classification Search
CPC ... B06B 1/0692; B06B 1/0644; B06B 1/0207; H01L 41/1132; H01L 41/18; H01L 41/0471; H01L 41/0472
See application file for complete search history.

(56) References Cited

U.S. PATENT DOCUMENTS

2008/0018563 A1* 1/2008 Shinohe ................. H01J 11/12
 345/60
2010/0039015 A1* 2/2010 Liu ........................ H01J 1/14
 977/939
2010/0311502 A1* 12/2010 Miller .................... A63F 1/02
 463/30
2019/0197284 A1* 6/2019 Park ..................... G06F 3/0412
2020/0379283 A1* 12/2020 Diguet .................. B60R 16/02

* cited by examiner

Controlling the actuating signal transmitting circuit 102 to transmit actuating signals to the piezoelectric layer 2 through the emission electrodes 51 — S10

Controlling the pixel circuit 103 to receive feedback signals outputted by the piezoelectric layer 2 through the receiving electrodes 41, to perform preset processing on the feedback signals, and to output the feedback signals after the preset processing — S20

FIG. 11

In the process of controlling the actuating signal transmitting circuit 102 to transmit the actuating signals to the piezoelectric layer 2 through the emission electrodes 51, outputting by a reset level signal terminal Vrst a first reset level to the control electrode of the first switching element M1 in the pixel circuit 103 to turn off the first switching element M1; and outputting by a drive level signal terminal Vsel a first drive level to the control electrode of the fourth switching element M4 to turn off the fourth switching element M4 — S201

↓

Outputting by the reset level signal terminal Vrst a second reset level to the control electrode of the first switching element M1 to turn on the first switching element M1; and after the first switching element M1 is turned on for a first preset time ta, outputting by the bias level signal terminal Vbias a second bias level to the first electrode of the first switching element M1 to enable the energy storage element Cp of the pixel circuit 103 to accumulate echo signals from the piezoelectric layer 2 — S202

↓

Outputting by the reset level signal terminal Vrst a first reset level to the control electrode of the first switching element M1 to turn off the first switching element M1 and enable the control electrode of the second switching element M2 of the pixel circuit 103 to receive the echo signals outputted by the energy storage element Cp; and outputting by the drive level signal terminal Vsel a second drive level to the control electrode of the fourth switching element M4 to turn on the fourth switching element M4 and enable the second electrode of the fourth switching element M4 to output amplified signals corresponding to the echo signals to the level output terminal Vout — S203

↓

Outputting by the reset level signal terminal Vrst the second reset level to the control electrode of the first switching element M1 to turn on the first switching element M1; and after the first switching element M1 is turned on for a second preset time tb, outputting by the bias level signal terminal Vbias the second bias level to the first electrode of the first switching element M1 to enable the energy storage element Cp to accumulate background signals outputted by the piezoelectric layer 2 — S204

↓

Outputting by the reset level signal terminal Vrst the first reset level to the control electrode of the first switching element M1 to turn off the first switching element M1 and enable the control electrode of the second switching element M2 to receive background signals outputted by the energy storage element Cp; and outputting by the drive level signal terminal Vsel the second drive level to the control electrode of the fourth switching element M4 to turn on the fourth switching element M4 and enable the second electrode of the fourth switching element M4 to output amplified signals corresponding to the background signals to the level output terminal Vout — S205

ULTRASONIC SENSING MODULE, ULTRASONIC SENSING DEVICE AND CONTROL METHOD THEREOF, DISPLAY DEVICE

CROSS-REFERENCE TO RELATED APPLICATION

The present application claims priority to Chinese Patent Application No. 201911168429.0, filed on Nov. 25, 2019 and entitled "ULTRASONIC SENSING MODULE, ULTRASONIC SENSING DEVICE AND CONTROL METHOD THEREOF, DISPLAY DEVICE", the disclosure of which is incorporated herein for all purposes by reference in its entirety as part of the present application.

TECHNICAL FIELD

Embodiments of the present disclosure relate to an ultrasonic sensing module, an ultrasonic sensing device and a control method thereof, and a display device.

BACKGROUND

An ultrasonic sensor based on the piezoelectric principle can use the inverse piezoelectric effect of a piezoelectric material acting as a transmitter (applying an alternating voltage in a particular direction to vibrate the piezoelectric material) to emit ultrasonic waves at a specific frequency. There is energy attenuation or phase change (time delay) in the propagation of ultrasonic waves. When the ultrasonic wave reaches a piezoelectric material acting as a receiver, the piezoelectric material undergoes a positive piezoelectric effect (the piezoelectric material generates electric charges under pressure), and the energy or phase change of the ultrasonic wave is detected.

Multiple such transmitters and receivers form an array according to a certain rule, and the ultrasonic wave propagation conditions on multiple paths can be detected. Therefore, the physical environment in the ultrasonic propagation path can be detected with the help of piezoelectric sensor arrays, such as fingerprint identifiers, touch switches, pressure sensors, imaging of internal organs in the human body, and inspection of metal products.

SUMMARY

At least one embodiment of the present disclosure provides an ultrasonic sensing module, which includes a first electrode layer, a piezoelectric layer, a receiving electrode layer and an emission electrode layer, wherein the first electrode layer is on a first side of the piezoelectric layer; and the receiving electrode layer and the emission electrode layer insulated from the receiving electrode layer are on a second side of the piezoelectric layer; and the second side is opposite to the first side.

At least one embodiment of the present disclosure provides an ultrasonic sensing device, which includes an actuating signal transmitting circuit, a pixel circuit and the ultrasonic sensing module according to any embodiment of the present disclosure; an output terminal of the actuating signal transmitting circuit is electrically connected with the emission electrode of the ultrasonic sensing module; and an input terminal of the pixel circuit is electrically connected with the receiving electrode of the ultrasonic sensing module.

At least one embodiment of the present disclosure provides a display device, which includes the ultrasonic sensing device according to any embodiment of the present disclosure.

At least one embodiment of the present disclosure provides a control method of an ultrasonic sensing device, which is applicable to the ultrasonic sensing device according to any embodiment of the present disclosure, and the control method includes: controlling the actuating signal transmitting circuit to transmit an actuating signal to the piezoelectric layer through the emission electrode; and controlling the pixel circuit to receive a feedback signal outputted by the piezoelectric layer through the receiving electrode, perform preset processing on the feedback signal, and output the feedback signal after the preset processing.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The ultrasonic sensing module based on the above piezoelectric principle generally comprises a first electrode, a second electrode and a piezoelectric layer. The first electrode and the second electrode are respectively disposed on opposite sides of the piezoelectric layer and form an electrode pair. The electrode pair not only act as an emission electrode to send electrical signals (such as alternating voltages) to the piezoelectric layer, but also act as a receiving electrode to receive electrical signals outputted by the piezoelectric layer. The conventional ultrasonic sensing module must use a thin-film transistor (TFT) as an electronic switch to switch two functions of the electrode pair to realize the time multiplexing of the two functions of the electrode pair. However, as the TFT cannot realize high switching frequency, the signal transmission rate will be limited, and then the conventional ultrasonic sensing module cannot realize ultrasonic beam control.

Figure 1:
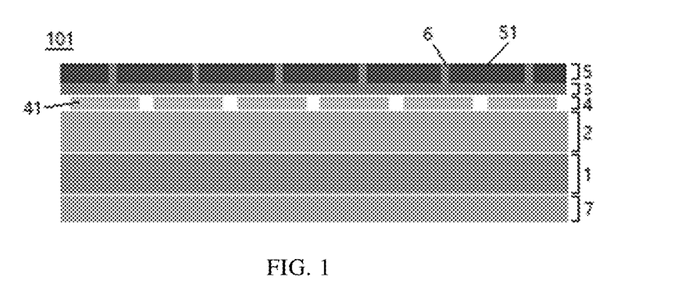
FIG. 1 is a schematic structural view of an ultrasonic sensing module provided by at least one embodiment of the present disclosure.

At least one embodiment of the present disclosure provides an ultrasonic sensing module 101, which, as shown in FIG. 1, comprises a first electrode layer 1, a piezoelectric layer 2, an insulating layer 3, a receiving electrode layer 4 and an emission electrode layer 5.

The first electrode layer 1 is disposed on a first side of the piezoelectric layer 2; the receiving electrode layer 4, the insulating layer 3 and the emission electrode layer 5 are sequentially laminated on a second side of the piezoelectric layer 2; and the second side is opposite to the first side. It could be understood that in some embodiments, the receiving electrode layer 4 and the emission electrode layer 5 may be arranged in the same layer and spaced from each other, so the ultrasonic sensing module 101 may not comprise the insulating layer 3.

The emission electrode layer 5 includes a plurality of emission electrodes 51 which are separated from each other. Each emission electrode 51 is configured to form an emission electrode pair with the first electrode layer 1.

The receiving electrode layer 4 includes a plurality of receiving electrodes 41 which are separated from each other. Each receiving electrode 41 is configured to form a receiving electrode pair with the first electrode layer 1.

The emission electrode 51 and the receiving electrode 41 are respectively disposed on two opposite surfaces of the insulating layer 3, are independent of each other in structure, and can be respectively configured to form an emission electrode pair and a receiving electrode pair which are independent of each other.

The emission electrode pair and the receiving electrode pair share the piezoelectric layer 2.

More specifically, the emission electrode 51 and the first electrode layer 1 form the emission electrode pair which is configured to receive actuating signals (such as alternating voltage) outputted by a component (such as an actuating signal transmitting circuit 102) other than the ultrasonic sensing module 101, so that the piezoelectric layer 2 vibrates and emits ultrasonic waves to the outside.

The receiving electrode 41 and the first electrode layer 1 form the receiving electrode pair which is configured to receive feedback signals outputted by the piezoelectric layer 2 and output the feedback signals to a component (such as a pixel circuit 103) other than the ultrasonic sensing module 101. For example, when the ultrasonic waves emitted by the piezoelectric layer 2 are reflected back to the piezoelectric layer 2, the piezoelectric layer 2 generates corresponding charges under the action of the ultrasonic waves, so as to output echo signals to the receiving electrode pair; and when the piezoelectric layer 2 does not emit and does not receive the ultrasonic waves, the piezoelectric layer outputs background signals to the receiving electrode pair.

In the ultrasonic sensing module 101 provided by at least one embodiment of the present disclosure, the emission electrode pair and the receiving electrode pair are independent of each other in structure and function, and thus the TFT for switching emission and receiving functions in the ultrasonic sensing module in other technical proposals can be omitted; the emission process and the receiving process of the ultrasonic waves can be independently controlled; the signal transmission rate is significantly improved; and ultrasonic beam control can be realized.

Figure 2:
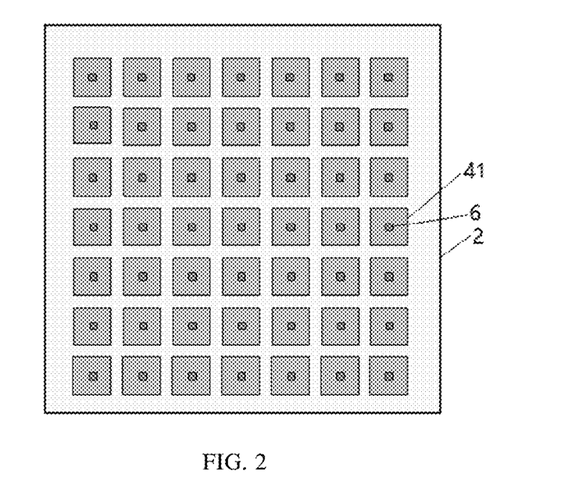
FIG. 2 is a schematic distribution diagram of receiving electrodes on a piezoelectric layer according to at least one embodiment of the present disclosure.

In an embodiment of the present disclosure, as shown in FIGS. 1 and 2, the receiving electrodes 41 are on the piezoelectric layer 2; the insulating layer 3 is on a side of the receiving electrode 41 facing away from the piezoelectric layer 2; and the emission electrodes 51 are on a side of the receiving insulating layer 3 facing away from the piezoelectric layer 2.

In FIG. 1, the piezoelectric layer 2, the receiving electrode 41, the insulating layer 3 and the emission electrode 51 are sequentially laminated from the bottom up, that is, the distance from the receiving electrode 41 to the piezoelectric layer 2 is smaller and the distance from the emission electrode 51 to the piezoelectric layer 2 is greater, which can reduce the shielding effect of the receiving electrode 41 on actuating signals outputted by the emission electrode 51 and meanwhile, can also improve the receiving sensitivity.

It should be noted that both the emission electrode 51 and the receiving electrode 41 can be manufactured by planar photolithography, and the shapes, the number and the distribution of the emission electrode 51 and the receiving electrode 41 can be determined according to actual design requirements.

As shown in FIG. 1, as the receiving electrode 41 is covered by the insulating layer 3, in order to further facilitate the electrical connection between the receiving electrode 41 and a component (such as the pixel circuit 103) other than the ultrasonic sensing module 101, in an embodiment of the present disclosure, as shown in FIGS. 1 and 2, each receiving electrode 41 is electrically connected with a wire 6. The wire 6 penetrates the insulating layer 3 along the thickness direction of the insulating layer 3 and is insulated from the emission electrode 51.

One end of the wire 6 is electrically connected with the receiving electrode 41, and the other end of the wire 6 penetrates the insulating layer 3 and is electrically connected with a component (such as the pixel circuit 103) other than the ultrasonic sensing module 101.

Figure 3:
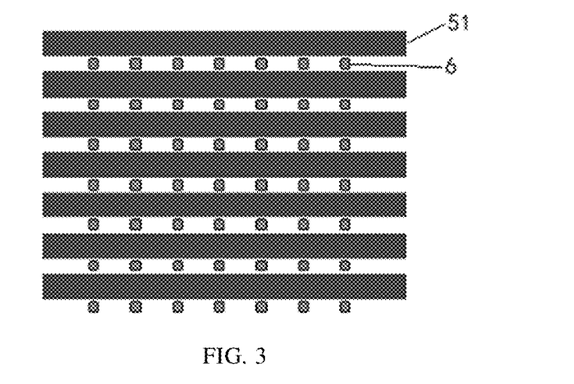
FIG. 3 is a schematic diagram illustrating a position relationship between emission electrodes and wires according to at least one embodiment of the present disclosure.

In an embodiment of the present disclosure, as shown in FIG. 3, the wire 6 and the emission electrode 51 may be spaced from each other by a preset distance, so that the wire and the emission electrode can be insulated from each other. Optionally, insulating materials may be provided between the wire 6 and the emission electrode 51 so that the wire and the emission electrode can be insulated from each other.

In an embodiment of the present disclosure, the wire 6 is a metal wire. Of course, the wire 6 may also be made from other materials having electrical conductivity.

In an embodiment of the present disclosure, part of each receiving electrode 41 is covered by the emission electrode 51, and the wire 6 is connected to the part of the receiving electrode 41 which is not covered by the emission electrode 51.

It should be noted that that part of the receiving electrode 41 being covered by the emission electrode 51 described in the embodiment refers to that in a plane parallel to the insulating layer 3, a projection of the emission electrode 51 and a projection of the receiving electrode 41 are at least partially overlapped and does not indicate that the receiving electrode 41 and the emission electrode 51 contact each other really.

It could be understood by those skilled in the art that as the wire 6 is connected to the part of the receiving electrode 41 not covered by the emission electrode 51, when the wire 6 penetrates the insulating layer 3 along the thickness direction of the insulating layer 3, it is guaranteed that the wire 6 and the emission electrode 51 do not contact each other, so that the wire 6 and the emission electrode 51 can be insulated from each other.

Figure 4A:
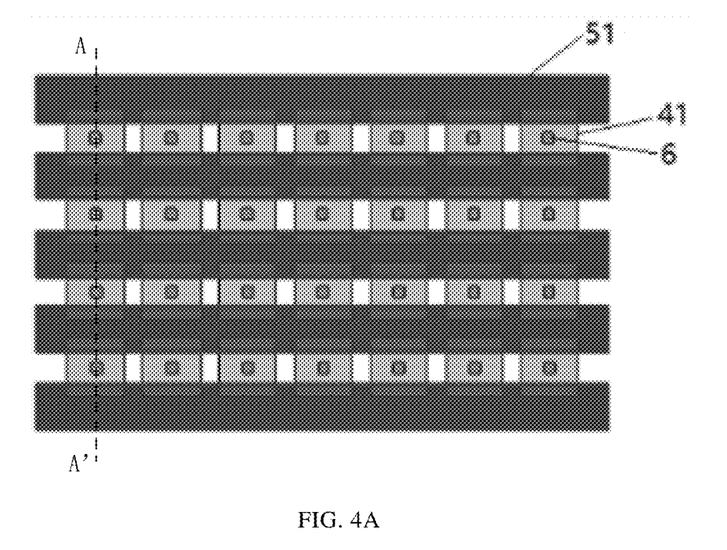
FIG. 4A is a schematic diagram illustrating a position relationship between emission electrodes and receiving electrodes according to at least one embodiment of the present disclosure.
Figure 4B:
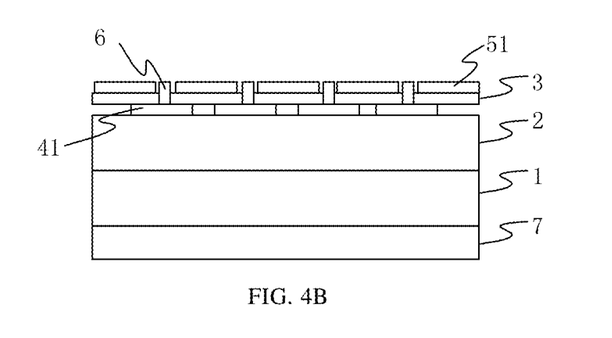
FIG. 4B is a schematic cross-sectional view along line A-A' in FIG. 4A.

In order to ensure that the wire 6 is insulated from the emission electrode 51, the emission electrode 51, the receiving electrode 41 and the wire 6 may adopt multiple arrangement manners. The following two arrangement manners are provided as follows as examples in the present disclosure:

First arrangement manner: as shown in FIGS. 4A and 4B, a plurality of receiving electrodes 41 are arranged in an array, for example, arranged in multiple rows and multiple columns, and the emission electrodes 51 have a strip shape. Two opposite side parts of the receiving electrode 41 in each row are respectively covered by two adjacent emission electrodes 51. The wire 6 is connected to a central part of the receiving electrode 41 which is not covered by the emission electrode 51.

As shown in FIGS. 4A and 4B, the ultrasonic sensing module 101 includes 4 rows of receiving electrodes 41; each row includes 7 receiving electrodes 41; and the ultrasonic sensing module 101 also includes 5 strip-shaped emission electrodes 51.

Two opposite side parts of the receiving electrode 41 in each row are respectively covered by two adjacent emission electrodes 51. For example, one side part of the receiving electrode 41 in the first row is covered by a first emission electrode 51; the other side part of the receiving electrode 41 in the first row is covered by a second emission electrode 51; one side part of the receiving electrode 41 in the second row is covered by the second emission electrode 51; and the other side part of the receiving electrode 41 in the second row is covered by a third emission electrode 51. The position relationships between other rows of receiving electrodes 41 and the emission electrodes 51 may refer to the above description, and no further description will be given here.

As the central part of each receiving electrode 41 is not covered by the emission electrode 51, the wire 6 is connected to the central part of the receiving electrode 41. When the wire 6 penetrates the insulating layer 3 along the thickness direction of the insulating layer 3, it is guaranteed that the wire 6 and the emission electrode 51 do not contact each other, so that the wire 6 and the emission electrode 51 can be insulated from each other.

Figure 5A:
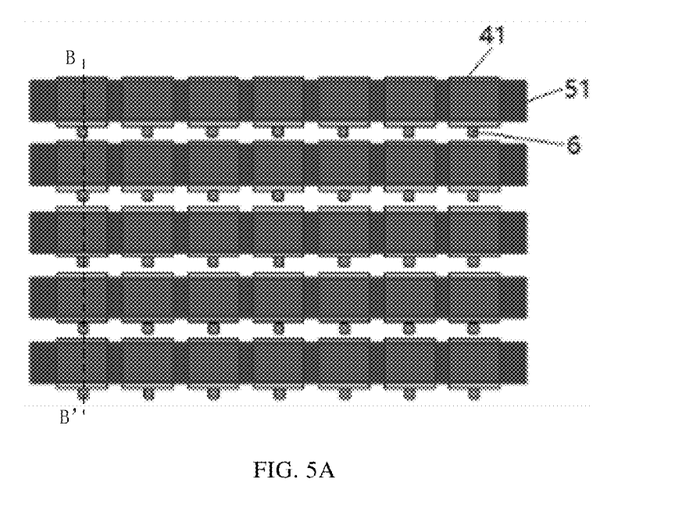
FIG. 5A is another schematic diagram illustrating the position relationship between the emission electrodes and the receiving electrodes according to at least one embodiment of the present disclosure.
Figure 5B:
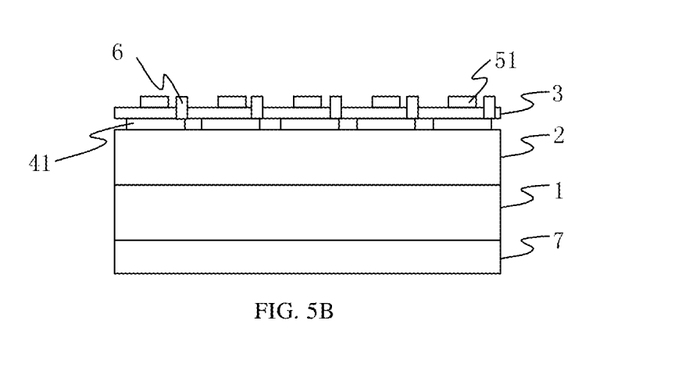
FIG. 5B is a schematic cross-sectional view along line B-B' in FIG. 5A.

Second arrangement manner: as shown in FIGS. 5A and 5B, a plurality of receiving electrodes 41 are arranged in an array, and the emission electrodes 51 each have a strip shape. Each emission electrode 51 covers central parts of receiving electrodes 41 in a row. The wire 6 is connected to the side part of the receiving electrode 41 which is not covered by the emission electrode 51.

As shown in FIGS. 5A and 5B, the ultrasonic sensing module 101 includes 5 rows of receiving electrodes 41; each row includes 7 receiving electrodes 41; and the ultrasonic sensing module 101 also includes 5 strip-shaped emission electrodes 51.

The central parts of the receiving electrodes 41 in the first row are covered by a first emission electrode 51, and the central parts of the receiving electrodes 41 in the second row is covered by a second emission electrode 51. The position relationships between other rows of receiving electrodes 41 and the emission electrodes 51 refer to the above description, and no further description will be given here.

As the side part of each receiving electrode 41 is not covered by the emission electrode 51, the wire 6 is connected to the side part of the receiving electrode 41. When the wire 6 penetrates the insulating layer 3 along the thickness direction of the insulating layer 3, it is guaranteed that the wire 6 and the emission electrode 51 do not contact each other, so that the wire 6 and the emission electrode 51 can be insulated from each other.

In an embodiment of the present disclosure, the distance between two opposite sides of the receiving electrode 41 is 50 μm-300 μm, and the spacing distance between two adjacent receiving electrodes 41 is 1 μm-10 μm.

As shown in FIG. 2, taking the case that a bottom surface of the receiving electrode 41 is a square as an example, the side of the bottom surface of the receiving electrode 41 is 50 μm-300 μm. The spacing distance between each receiving electrode 41 and any adjacent receiving electrode 41 is 1 μm-10 μm.

Certainly, the bottom surface of the receiving electrode 41 may also be of other shapes such as a serpentine shape, a ring shape, etc. The distance between two opposite sides in the receiving electrode 41 of other shapes may refer to the dimension of the bottom surface of the receiving electrode 41 in a preset direction.

In an embodiment of the present disclosure, the material of the emission electrode 51 includes at least one of aluminum, molybdenum, titanium, copper or gold. Optionally, the emission electrode 51 may be a laminated structure formed by at least two of the above-mentioned metals. The thickness of the emission electrode 51 may be determined according to actual design requirements. For example, the thickness of the emission electrode 51 may be 0.2 μm.

In an embodiment of the present disclosure, the material of the insulating layer 3 includes silicon oxide or silicon nitride.

In an embodiment of the present disclosure, the thickness of the insulating layer is 0.1 μm-1 μm.

In an embodiment of the present disclosure, the material of the piezoelectric layer 2 may include polyvinylidene fluoride (PVDF). However, it could be understood that the embodiment of the present disclosure is not limited thereto, and in other embodiments, any appropriate piezoelectric material may be adopted according to actual requirements.

In an embodiment of the present disclosure, the thickness of the piezoelectric layer 2 is 5 μm-30 μm. For example, the thickness of the piezoelectric layer 2 is 10 μm.

In an embodiment of the present disclosure, as shown in FIG. 1, the ultrasonic sensing module 101 includes a protective film 7 which is disposed on a side of the first electrode layer 1 facing away from the piezoelectric layer 2.

It could be understood by those skilled in the art that the ultrasonic sensing module 101 may also include other film layers according to acoustic performance, physical connection relationship and the like, apart from the described structures in the above embodiments. No specific detail will be given in the description.

Figure 6:
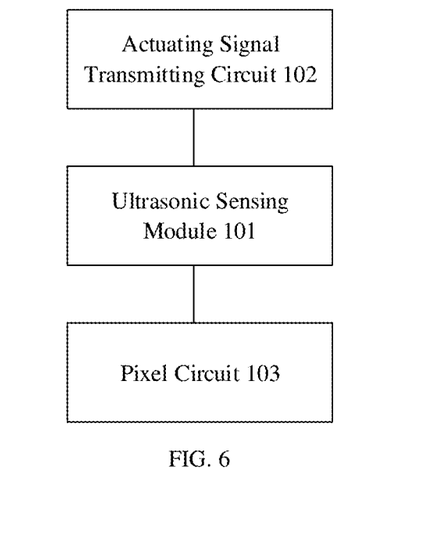
FIG. 6 is a schematic block diagram of an ultrasonic sensing device provided by at least one embodiment of the present disclosure.

Based on the same inventive concept, at least one embodiment of the present disclosure further provides an ultrasonic sensing device. As shown in FIG. 6, the ultrasonic sensing device comprises an actuating signal transmitting circuit 102, a pixel circuit 103 and the ultrasonic sensing module 101 provided by the above embodiments of the present disclosure.

Figure 7:
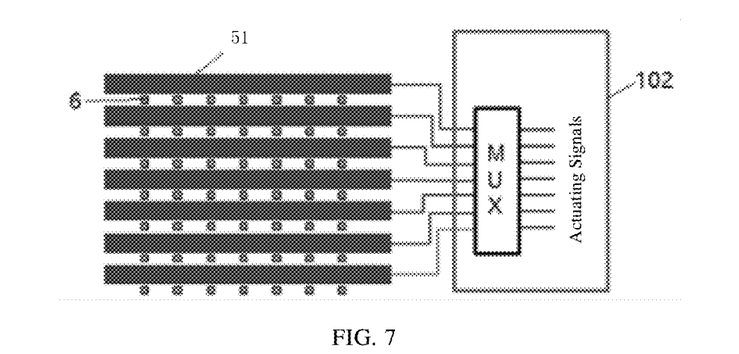
FIG. 7 is a first schematic structural partial view of an ultrasonic sensing device provided by at least one embodiment of the present disclosure, illustrating the connection between an actuating signal transmitting circuit and emission electrodes.

As shown in FIG. 7, an output terminal of the actuating signal transmitting circuit 102 is electrically connected with the emission electrode 51 of the ultrasonic sensing module 101, and an input terminal of the pixel circuit 103 is electrically connected with the receiving electrode 41 of the ultrasonic sensing module 101.

Figure 8:
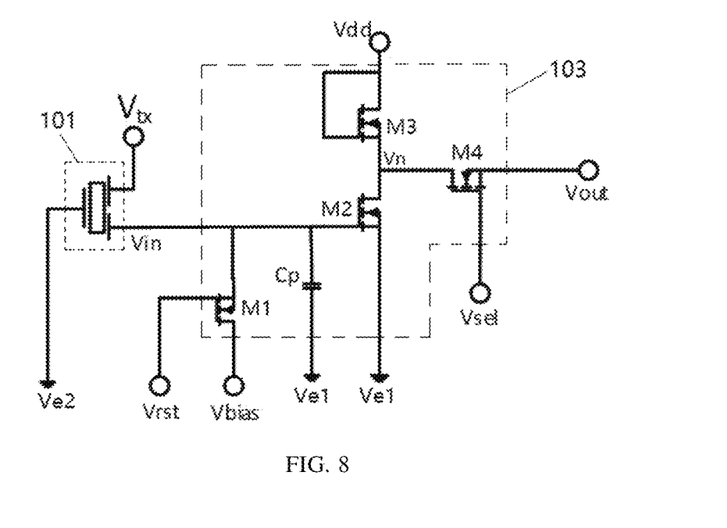
FIG. 8 is a second schematic structural partial view of an ultrasonic sensing device provided by at least one embodiment of the present disclosure, illustrating the connection between a pixel circuit and the emission electrodes.

It should be noted that the Vin terminal in FIG. 8 is the input terminal of the pixel circuit 103, and the Vin terminal is connected with the receiving electrode 41 of the ultrasonic sensing module 101; the Vtx terminal in FIG. 8 is the output terminal of the actuating signal transmitting circuit 102, and the Vtx terminal is connected with the emission electrode 51 of the ultrasonic sensing module 101; and the reference level terminal Ve2 in FIG. 8 is connected with the first electrode layer 1 of the ultrasonic sensing module 101.

The actuating signal transmitting circuit 102 transmits actuating signals (such as alternating voltages) to the emission electrode 51. The emission electrode 51 outputs the actuating signal to the piezoelectric layer 2, so that the piezoelectric layer 2 vibrates and emits ultrasonic waves to the outside.

The receiving electrode 41 receives feedback signals outputted by the piezoelectric layer 2 and outputs the feedback signals to the pixel circuit 103. For example, when the ultrasonic waves emitted by the piezoelectric layer 2 are reflected back to the piezoelectric layer 2, the piezoelectric layer 2 generates corresponding charges under the pressure of the ultrasonic waves and then outputs echo signals to the receiving electrode, and the receiving electrode 41 outputs the echo signals to the pixel circuit 103; and when the piezoelectric layer 2 does not emit and does not receive ultrasonic waves, the piezoelectric layer outputs background signals to the receiving electrode, and the receiving electrode 41 outputs the background signals to the pixel circuit 103.

When ultrasonic beam control is applied, high-speed actuating signals are sent to the emission electrode 51, so the control of the signal delay time is very important. The conventional glass-based transistor element is difficult to send high-speed actuating signals to the emission electrode 51, so the actuating signal transmitting circuit 102 is adopted in the embodiment of the present disclosure to send the high-speed actuating signals to the emission electrode 51.

In an embodiment of the present disclosure, as shown in FIG. 8, the pixel circuit 103 includes a first switching element M1, a second switching element M2, a third switching element M3, a fourth switching element M4 and an energy storage element Cp.

A second electrode of the first switching element M1, a control electrode of the second switching element M2, and a first terminal of the energy storage element Cp are electrically connected with the input terminal of the pixel circuit 103.

A first electrode of the second switching element M2, a second electrode of the third switching element M3, and a first electrode of the fourth switching element M4 are electrically connected to the same node (a node Vn in FIG. 8).

A first electrode and a control electrode of the first switching element M1 are respectively configured to be electrically connected with a reset level signal terminal Vrst and a bias level signal terminal Vbias.

A first electrode and a control electrode of the third switching element M3 are configured to be electrically connected with a level input terminal Vdd; a second electrode and a control electrode of the fourth switching element M4 are respectively configured to be electrically connected with a level output terminal Vout and a drive level signal terminal Vsel; and a second electrode of the second switching element M2 and a second terminal of the energy storage element Cp are configured to be electrically connected with a reference level terminal Ve1.

Optionally, the first to fourth switching elements may be all TFTs. A first electrode of the switching element is a source electrode of the TFT; a second electrode of the switching element is a drain electrode of the TFT; and a control electrode of the switching element is a gate electrode of the TFT. However, it could be understood that in other embodiments, at least one of the first to fourth switching elements may also be a field-effect transistor (FET) or other switching elements with same characteristics, and the embodiments of the present disclosure have no limitation in this aspect.

Figure 9:
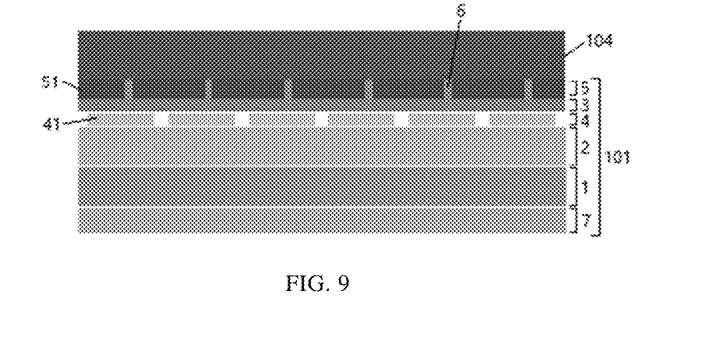
FIG. 9 is a third schematic structural partial view of the ultrasonic sensing device provided by at least one embodiment of the present disclosure, illustrating the position relationship between an ultrasonic sensing module and an array substrate.

In an embodiment of the present disclosure, as shown in FIG. 9, the ultrasonic sensing device comprises an array substrate 104; the pixel circuit 103 is integrated in the array substrate 104; and the array substrate 104 is disposed on a side of the emission electrode layer 5 facing away from the insulating layer 3. The input terminal of the pixel circuit 103 is electrically connected with the receiving electrode 41 through the wire 6 penetrating the insulating layer 3.

In FIG. 9, the piezoelectric layer 2, the receiving electrode 41, the insulating layer 3, the emission electrode 51 and the array substrate 104 are sequentially laminated from the bottom up. One end of the wire 6 is electrically connected with the receiving electrode 41, and the other end of the wire 6 penetrates the insulating layer 3 is electrically connected with the output terminal of the pixel circuit 103 on the array substrate 104. The receiving electrode 41 receives feedback signals outputted by the piezoelectric layer 2 and outputs the feedback signals to the pixel circuit 103 through the wire 6.

In an embodiment of the present disclosure, the array substrate 104 may be a glass substrate, and the pixel circuit 103 may be manufactured on the glass substrate by photolithography.

In an embodiment of the present disclosure, as shown in FIG. 7, the actuating signal emission circuit 102 includes a multiplexer (MUX); each output terminal of the multiplexer is electrically connected with a corresponding emission electrode 51; and actuating signals are outputted to the emission electrodes 51 through the multiplexer.

The ultrasonic sensing device provided by the embodiment of the present disclosure has the same inventive concept and the same advantages as the above embodiments, and the content not shown in detail with respect to the ultrasonic sensing device may refer to the above embodiments. No further description will be given herein.

Figure 10:
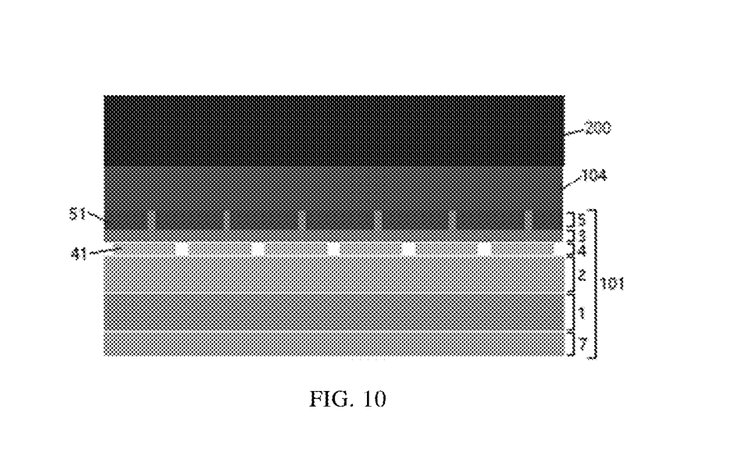
FIG. 10 is a schematic structural partial view of a display device provided by at least one embodiment of the present disclosure.

Based on the same inventive concept, at least one embodiment of the present disclosure further provides a display device. As shown in FIG. 10, the display device comprises the ultrasonic sensing device provided by the above embodiments of the present disclosure.

Optionally, in an embodiment of the present disclosure, as shown in FIG. 10, the display device comprises a display panel and a protective cover. It should be noted that a component with the reference numeral of 200 in FIG. 10 not only can represent the display panel but also can represent the protective cover, or may also be a combination of the display panel and the protective cover. No limitation will be given here in the embodiment of the present disclosure.

For example, the display panel may be a liquid crystal display (LCD) panel, an organic light-emitting diode (OLED) display panel, a quantum dot light light-emitting diode (QLED) display panel, a micro light-emitting diode (Micro-LED) display panel, etc. No limitation will be given here in the embodiment of the present disclosure.

For example, the protective cover may be a glass plate, a plastic plate, etc. No limitation will be given here in the embodiment of the present disclosure.

The side of the array substrate 104 of the ultrasonic sensing device, facing away from the insulating layer 3, is bonded to the display panel or the protective cover.

In FIG. 10, the piezoelectric layer 2, the receiving electrode 41, the insulating layer 3, the emission electrode 51, the array substrate 104 and the display panel (or the protective cover) are sequentially laminated from the bottom up.

In an embodiment of the present disclosure, the array substrate 104 and the display panel (or the protective cover) may be connected with each other through an adhesive. In order to avoid the influence of the adhesive on the attenuation of the ultrasonic waves as much as possible, the thickness of the adhesive may be set to be less than 100 μm. Optionally, the adhesive may be an optically clear adhesive (OCA).

Optionally, the structure of the display panel and the protective cover may be correspondingly optimized according to the acoustic wave transmission efficiency.

The display device provided by the embodiment of the present disclosure has the same inventive concept and same advantages with the above embodiments. The content not shown in detail with respect to the display device may refer to the above embodiments. No further description will be given here.

Figure 11:
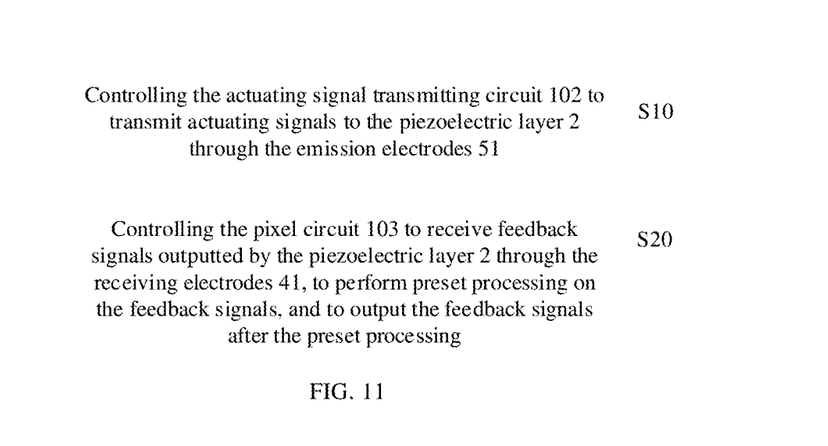
FIG. 11 is a schematic flow chart illustrating a control method of an ultrasonic sensing device provided by at least one embodiment of the present disclosure.

Based on the same inventive concept, at least one embodiment of the present disclosure further provides a control method of an ultrasonic sensing device, which is applicable to the ultrasonic sensing device provided by the above embodiments of the present disclosure. The schematic flow chart of the control method is as shown in FIG. 11, and the control method comprises:

S10: controlling the actuating signal transmitting circuit 102 to transmit actuating signals to the piezoelectric layer 2 through the emission electrodes 51.

S20: controlling the pixel circuit 103 to receive feedback signals outputted by the piezoelectric layer 2 through the receiving electrodes 41, to perform preset processing on the feedback signals, and to output the feedback signals after the preset processing.

Figure 13:
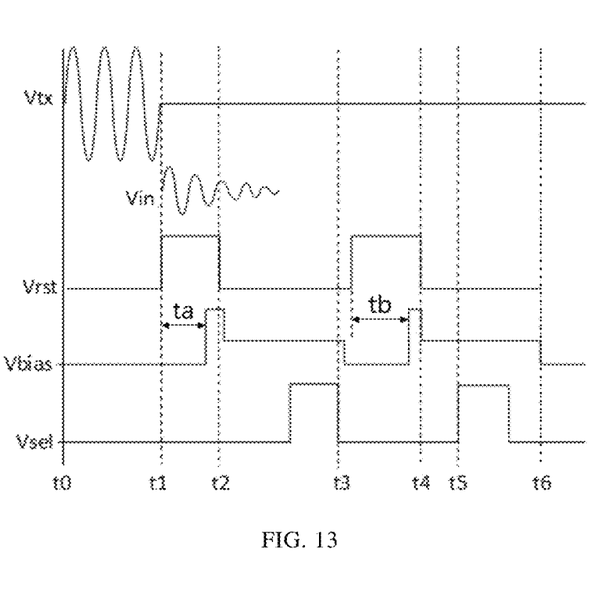
FIG. 13 is a working timing diagram of signal terminals connected with the pixel circuit according to at least one embodiment of the present disclosure.

It should be noted that the step S10 and part of the sub-steps in the step S20 may be executed at the same time. Both the step S10 and part of the sub-steps in the step S20 are executed, for example, within a time period from t0 to t1 in the timing chart as shown in FIG. 13.

At step S10, the actuating signal transmitting circuit 102 is controlled to output the actuating signals to the emission electrodes 51, and the emission electrodes 51 output the actuating signals to the piezoelectric layer 2, so that the piezoelectric layer 2 vibrates and emits ultrasonic waves to the outside.

At step S20, the piezoelectric layer 2 outputs the feedback signals to the receiving electrodes 41; the receiving electrodes 41 output the feedback signals to the pixel circuit 103; and the pixel circuit 103 performs preset processing on the feedback signals and outputs the feedback signals after the preset processing.

For example, when the ultrasonic waves emitted by the piezoelectric layer 2 are reflected back to the piezoelectric layer 2, the piezoelectric layer 2 generates corresponding charges under the pressure of the ultrasonic waves, so as to output echo signals to the receiving electrode pair; the receiving electrodes 41 output the echo signals to the pixel circuit 103; and the pixel circuit 103 performs preset processing on the echo signals and outputs the echo signals after the preset processing.

When the piezoelectric layer 2 does not emit and does not receive ultrasonic waves, the piezoelectric layer outputs background signals to the receiving electrode pair; the receiving electrodes 41 output the background signals to the pixel circuit 103; and the pixel circuit 103 performs preset processing on the background signals and outputs the background signals after the preset processing.

The control method of the ultrasonic sensing device provided by the embodiment of the present disclosure has the same inventive concept and same advantages with the above embodiments. The content not shown in detail in the control method of the ultrasonic sensing device may refer to the above embodiments. No further description will be given here.

Optionally, an embodiment of the present disclosure further provides a specific implementation of the step S20. The step S20 may be divided into multiple phases. The phases of the step S20 approximately correspond to the time periods in FIG. 13. The first phase of the step S20 approximately corresponds to the time period from t0 to t1 in FIG. 13; the second phase of the step S20 approximately corresponds to the time period from t1 to t2 in FIG. 13; and the third phase of the step S20 approximately corresponds to the time period from t2 to t3 in FIG. 13.

It should be noted that the above content describes the approximate correspondence between the phases of the step S20 and the time periods in FIG. 13, so the time (such as t0, t1 and t2) in FIG. 13 cannot be strictly used as boundaries between the phases of step S20.

Figure 12:
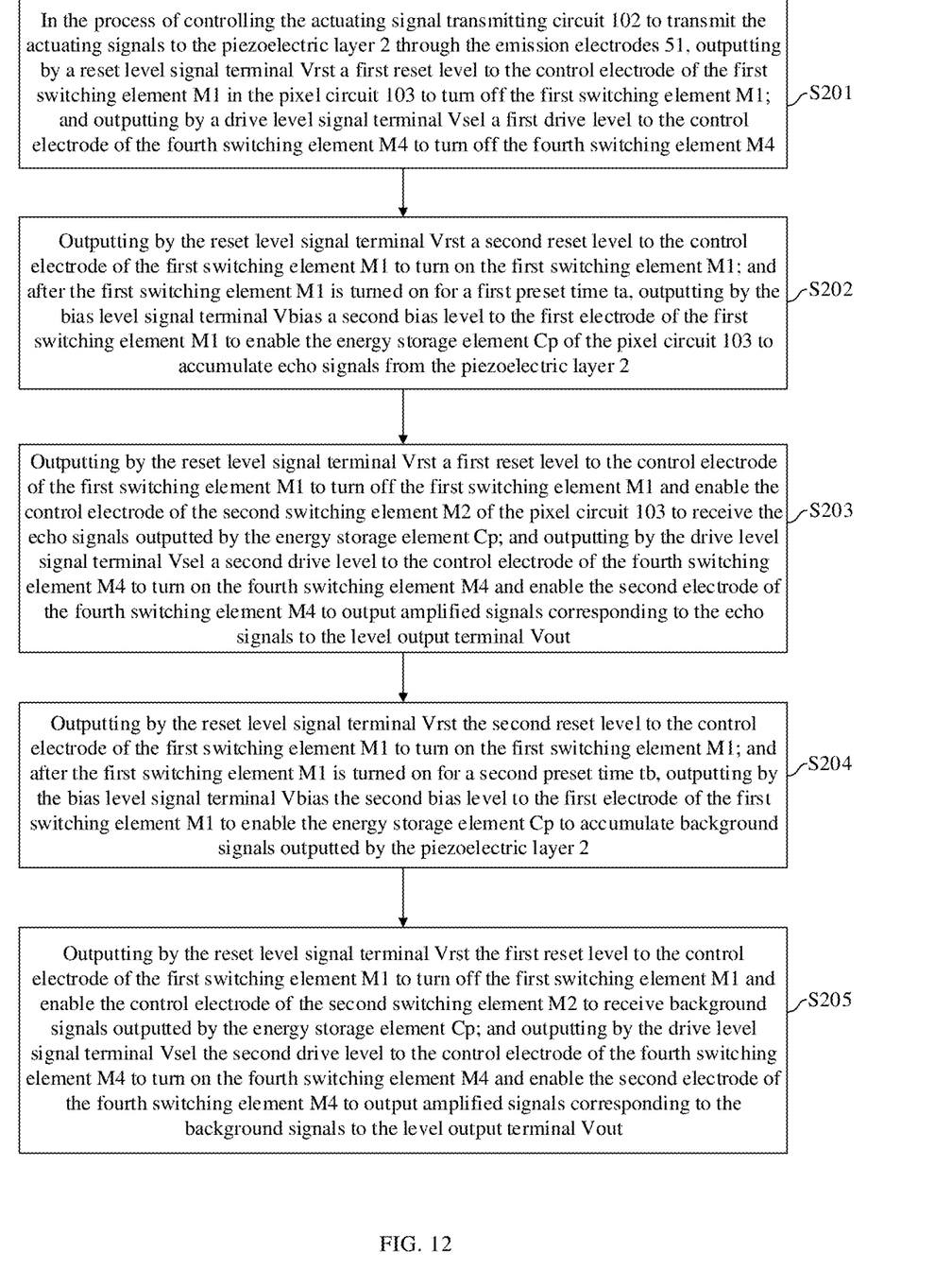
FIG. 12 is a schematic flow chart illustrating a specific implementation of a step S20 in at least one embodiment of the present disclosure.

The flow chart of a particular implementation of step S20 is shown in FIG. 12, and the particular implementation of step S20 includes:

S201: in the process of controlling the actuating signal transmitting circuit 102 to transmit the actuating signals to the piezoelectric layer 2 through the emission electrodes 51, outputting by a reset level signal terminal Vrst a first reset level to the control electrode of the first switching element M1 in the pixel circuit 103 to turn off the first switching element M1; and outputting by a drive level signal terminal Vsel a first drive level to the control electrode of the fourth switching element M4 to turn off the fourth switching element M4.

In at least one embodiment of the present disclosure, the reset level signal terminal Vrst can output a first reset level and a second reset level, and the first reset level is lower than the second reset level. When the reset level signal terminal Vrst outputs the first reset level, the first switching element M1 is turned off; and when the reset level signal terminal Vrst outputs the second reset level, the first switching element M1 is turned on.

The drive level signal terminal Vsel can output a first drive level and a second drive level, and the first drive level is lower than the second drive level. When the drive level signal terminal Vsel outputs the first drive level, the fourth switching element M4 is turned off; and when the drive level signal terminal Vsel outputs the second drive level, the fourth switching element M4 is turned on.

In FIG. 13, the waveform of Vtx during the time period from t0 to t1 represents the actuating signals outputted by the actuating signal transmitting circuit 102. It can be clearly seen that the step S201 and the step S10 can be simultaneously executed. When the first switching element M1 is turned off, the receiving electrode 41 of the ultrasonic sensing device is suspended. In this case, the emission electrodes 51 of the ultrasonic sensing device receive the actuating signals outputted by the actuating signal transmitting circuit 102, and the piezoelectric layer 2 emits ultrasonic waves to the outside.

At step S201, the first switching element M1 should have large turn-off resistance to ensure that the receiving electrode 41 can be in a good floating state and avoid the actuating signals outputted by the emission electrode 51 from being shielded. In addition, on the premise of satisfying the emission intensity, the peak-to-peak voltage of the actuating signals outputted by the emission electrode 51 should be low (for example, within 100V) to prevent the transistor from being broken down.

Optionally, as shown in FIG. 13, during the time period from t0 to t1, the bias level signal terminal Vbias outputs a first bias level.

S202: outputting by the reset level signal terminal Vrst a second reset level to the control electrode of the first switching element M1 to turn on the first switching element M1; and after the first switching element M1 is turned on for a first preset time ta, outputting by the bias level signal terminal Vbias a second bias level to the first electrode of the first switching element M1 to enable the energy storage element Cp of the pixel circuit 103 to accumulate echo signals from the piezoelectric layer 2.

At step S202, the actuating signal transmitting circuit 102 stops transmitting the actuating signals at t1, and the control electrode of the first switching element M1 receives the second reset level outputted by the reset level signal terminal Vrst first to turn on the first switching element M1; and at this point, the bias level signal terminal Vbias still outputs the first bias level. After the first switching element M1 is turned on for the first preset time ta, the bias level signal terminal Vbias outputs the second bias level, and the first electrode of the first switching element M1 receives the second bias level outputted by the bias level signal terminal Vbias, so that the energy storage element Cp of the pixel circuit 103 accumulates the echo signals outputted by the piezoelectric layer 2. In FIG. 13, the waveform of Vin after t1 represents the echo signals outputted by the piezoelectric layer 2.

As shown in FIG. 13, the second bias level outputted by the bias level signal terminal Vbias is higher than the first bias level; the duration during which the first electrode of the first switching element M1 receives the second bias level in the second phase may be quarter or half of the period of controlling the actuating signal transmitting circuit 102 to output the actuating signals at step S10. The duration during which the first electrode of the first switching element M1 receives the second bias level in the second phase may also be other values.

S203: outputting by the reset level signal terminal Vrst a first reset level to the control electrode of the first switching element M1 to turn off the first switching element M1 and enable the control electrode of the second switching element M2 of the pixel circuit 103 to receive the echo signals outputted by the energy storage element Cp; and outputting by the drive level signal terminal Vsel a second drive level to the control electrode of the fourth switching element M4 to turn on the fourth switching element M4 and enable the second electrode of the fourth switching element M4 to output amplified signals corresponding to the echo signals to the level output terminal Vout.

At step S203, as shown in FIG. 13, the reset level signal terminal Vrst outputs the first reset level at t2, and the control electrode of the first switching element M1 receives the first reset level outputted by the reset level signal terminal Vrst, so that the first switching element M1 is turned off.

The bias level signal terminal Vbias may output a third bias level at t2; as shown in FIG. 13, the bias level signal terminal Vbias may also output the third bias level at a moment after t2, close to t2. The third bias level outputted by the bias level signal terminal Vbias is higher than the first bias level and lower than the second bias level.

As shown in FIG. 13, the drive level signal terminal Vsel outputs the second drive level at a moment between t2 and t3, and the control electrode of the fourth switching element M4 receives the second drive level outputted by the drive level signal terminal Vsel, so that the fourth switching element M4 is turned on. The echo signals accumulated by the energy storage element Cp are amplified through the second switching element M2 and the third switching element M3, and the second electrode of the fourth switching element M4 outputs amplified signals corresponding to the echo signals to the level output terminal Vout.

In an embodiment of the present disclosure, step S20 may also include a fourth phase and a fifth phase; the fourth phase of step S20 approximately corresponds to the time period from t3 to t4 in FIG. 13; and the fifth phase of step S20 approximately corresponds to the time period from t4 to t6 in FIG. 13.

It should be noted that the above content describes the approximate correspondence between the fourth phase and the fifth phase of step S20 and the time periods in FIG. 13, so the time (such as t3, t3 and t5) in FIG. 13 cannot be strictly used as boundaries between the phases of step S20.

Optionally, the schematic flow chart of a particular implementation of step S20, as shown in FIG. 12, further includes:

S204: outputting by the reset level signal terminal Vrst the second reset level to the control electrode of the first switching element M1 to turn on the first switching element M1; and after the first switching element M1 is turned on for a second preset time tb, outputting by the bias level signal terminal Vbias the second bias level to the first electrode of the first switching element M1 to enable the energy storage element Cp to accumulate background signals outputted by the piezoelectric layer 2.

As shown in FIG. 13, the reset level signal terminal Vrst outputs the second reset level at a moment after t3 and close to t3, and the control electrode of the first switching element M1 receives the second reset level outputted by the reset level signal terminal Vrst, so that the first switching element M1 is turned on. The bias level signal terminal Vbias outputs the first bias level at a moment after t3 and close to t3. Signals of the control electrode of the second switching element M2 are cleared.

As shown in FIG. 13, the drive level signal terminal Vsel outputs the first drive level at t3, and the control electrode of the fourth switching element M4 receives the first drive level outputted by the drive level signal terminal Vsel, so that the fourth switching element M4 is turned off.

As shown in FIG. 13, after the first switching element M1 is turned on for the second preset time tb, the bias level signal terminal Vbias outputs the second bias level, and the first electrode of the first switching element M1 receives the second bias level outputted by the bias level signal terminal Vbias, so that the energy storage element Cp of the pixel circuit 103 accumulates background signals outputted by the piezoelectric layer 2.

The duration during which the first electrode of the first switching element M1 receives the second bias level in the fourth phase may be quarter or half of the period of controlling the actuating signal transmitting circuit 102 to output the actuating signals in step S10. The duration during which the first electrode of the first switching element M1 receives the second bias level in the fourth phase may also be other values.

S205: outputting by the reset level signal terminal Vrst the first reset level to the control electrode of the first switching element M1 to turn off the first switching element M1 and enable the control electrode of the second switching element M2 to receive background signals outputted by the energy storage element Cp; and outputting by the drive level signal terminal Vsel the second drive level to the control electrode of the fourth switching element M4 to turn on the fourth switching element M4 and enable the second electrode of the fourth switching element M4 to output amplified signals corresponding to the background signals to the level output terminal Vout.

At step S205, the reset level signal terminal Vrst outputs the first reset level at t4, and the control electrode of the first switching element M1 receives the first reset level outputted by the reset level signal terminal Vrst, so that the first switching element M1 is turned off. The bias level signal terminal Vbias outputs the third bias level at t4.

As shown in FIG. 13, the drive level signal terminal Vsel outputs the second drive level at t5, and the control electrode of the fourth switching element M4 receives the second drive level outputted by the drive level signal terminal Vsel, so that the fourth switching element M4 is turned on. The background signals accumulated by the energy storage element Cp are amplified through the second switching element M2 and the third switching element M3, and the second electrode of the fourth switching element M4 outputs amplified signals corresponding to background signals to the level output terminal Vout.

As shown in FIG. 13, the drive level signal terminal Vsel outputs the first drive level at a moment between t5 and t6, and the control electrode of the fourth switching element M4 receives the first drive level outputted by the drive level signal terminal Vsel, so that the fourth switching element M4 is turned off, and one control period of the ultrasonic sensing device is ended.

The application of some embodiments of the present disclosure at least can realize the following advantages:

1. The emission electrode pair and the receiving electrode pair in the ultrasonic sensing module are independent of each other in structure and function, and thus the TFT for switching emission and receiving functions in the conventional ultrasonic sensing module can be omitted; the emission process and the receiving process of the ultrasonic waves can be independently controlled; the signal transmission rate is significantly improved; and ultrasonic beam control can be realized.

2. In the ultrasonic sensing module, the distance from the receiving electrode to the piezoelectric layer is smaller than the distance from the emission electrode to the piezoelectric layer, which can reduce the shielding effect of the receiving electrode on the actuating signals outputted by the emission electrode and meanwhile, can also improve the receiving sensitivity.

It could be understood by those skilled in the art that the steps, measures and solutions in the operations, methods, flows that have been discussed in the present disclosure can be substituted, changed, combined, or deleted. Moreover, other steps, measures and solutions including the operations, methods, flows that have been discussed in the present disclosure can also be substituted, modified, rearranged, decomposed, combined, or deleted. Further, solutions in the prior art including the steps, measures and solutions in the operations, methods, flows disclosed in the present disclosure can also be substituted, modified, rearranged, decomposed, combined, or deleted.

In the description of the present disclosure, particular features, structures, materials or characteristics may be combined in any suitable manner in one or more embodiments or examples.

It could be understood that although the steps in the flow chart of the drawings are sequentially displayed in accordance with the directions of the arrows, these steps are not necessarily performed in the order indicated by the arrows. Unless explicitly stated herein, the execution of these steps is not strictly limited, and the steps can be performed in other orders. Moreover, at least a part of the steps in the flow chart of the drawing may include multiple sub-steps or multiple stages. These sub-steps or stages are not necessarily performed at the same time, but may be performed at different times. The execution order is also not necessarily sequential, but these sub-steps or stages can be performed in turn or alternately with other steps or at least a part of the sub-steps or stages of other steps.

What are described above is related to the illustrative embodiments of the disclosure only and not limitative to the scope of the disclosure; the scopes of the disclosure are defined by the accompanying claims.

What is claimed is:

1. An ultrasonic sensing module, comprising a first electrode layer, a piezoelectric layer, a receiving electrode layer and an emission electrode layer,
wherein the first electrode layer is on a first side of the piezoelectric layer;
the receiving electrode layer and the emission electrode layer insulated from the receiving electrode layer are on a second side of the piezoelectric layer; and the second side of the piezoelectric layer is opposite to the first side, of the piezoelectric layer;
the emission electrode layer comprises a plurality of emission electrodes which are separated from each other; each of the plurality of emission electrodes is configured to form an emission electrode pair with the first electrode layer; and
the receiving electrode layer comprises a plurality of receiving electrodes which are separated from each other; and each of the plurality of receiving electrodes is configured to form a receiving electrode pair with the first electrode layer.

2. The ultrasonic sensing module according to claim 1, further comprising an insulating layer,
wherein the insulating layer is between the receiving electrode layer and the emission electrode layer.

3. The ultrasonic sensing module according to claim 2, wherein
a thickness of the insulating layer is in a range of 0.1 µm to 1 µm; and
a thickness of the piezoelectric layer is in a range of 5 µm to 30 µm.

4. The ultrasonic sensing module according to claim 1, wherein
the receiving electrodes contact the piezoelectric layer;
the insulating layer is on a side of the receiving electrode facing away from the piezoelectric layer; and
the emission electrode is on a side of the receiving insulating layer facing away from the piezoelectric layer.

5. The ultrasonic sensing module according to claim 4, further comprising a plurality of wires,
wherein each of the plurality of wires is electrically connected with one of the plurality of receiving electrodes; and
the wire penetrates the insulating layer along a thickness direction of the insulating layer and is insulated from the emission electrode.

6. The ultrasonic sensing module according to claim 5, wherein each of the plurality of receiving electrodes is partially covered by the emission electrode; and the wire is connected to a part of the receiving electrode which is not covered by the emission electrode.

7. The ultrasonic sensing module according to claim 6, wherein the plurality of receiving electrodes are arranged in an array, and the emission electrode has a strip shape;
two opposite side parts of the receiving electrodes in each row are respectively covered by two adjacent emission electrodes; and
the wire is connected to a central part of the receiving electrode which is not covered by the emission electrode.

8. The ultrasonic sensing module according to claim 6, wherein the plurality of receiving electrodes are arranged in an array, and the emission electrode has a strip shape;
each emission electrode covers central parts of the receiving electrodes in one row; and
the wire is connected to a side part of the receiving electrode which is not covered by the emission electrode.

9. The ultrasonic sensing module according to claim 1, wherein
a distance between two opposite sides of the receiving electrode is in a range of 50 µm to 300 µm; and
a distance between two adjacent receiving electrodes is in a range of 1 µm to 10 µm.

10. The ultrasonic sensing module according to claim 1, wherein
a material of the emission electrode comprises at least one of a group consisting of aluminum, molybdenum, titanium, copper and gold;
a material of the insulating material comprises silicon oxide or silicon nitride; and
a material of the piezoelectric layer comprises polyvinylidene fluoride.

11. An ultrasonic sensing device, comprising an actuating signal transmitting circuit, a pixel circuit and an ultrasonic sensing module,
wherein the ultrasonic sensing module comprises a first electrode layer, a piezoelectric layer, a receiving electrode layer and an emission electrode layer;
the first electrode layer is disposed on a first side of the piezoelectric layer;
the receiving electrode layer and the emission electrode layer insulated from the receiving electrode layer are on a second side of the piezoelectric layer; the second side of the piezoelectric layer is opposite to the first side of the piezoelectric layer;
the ultrasonic sensing module further comprises an insulating layer between the receiving electrode layer and the emission electrode layer;
the emission electrode layer comprises a plurality of emission electrodes which are separated from each other; each of the plurality of emission electrodes is configured to form an emission electrode pair with the first electrode layer;
the receiving electrode layer comprises a plurality of receiving electrodes which are separated from each of other; each of the plurality of receiving electrodes is configured to form a receiving electrode pair with the first electrode layer; and
an output terminal of the actuating signal transmitting circuit is electrically connected with the emission electrode of the ultrasonic sensing module; and
an input terminal of the pixel circuit is electrically connected with the receiving electrode of the ultrasonic sensing module.

12. The ultrasonic sensing device according to claim 11, wherein the pixel circuit comprises a first switching element, a second switching element, a third switching element, a fourth switching element and an energy storage element;
a second electrode of the first switching element, a control electrode of the second switching element, and a first terminal of the energy storage element are electrically connected with the input terminal of the pixel circuit; a first electrode of the second switching element, a second electrode of the third switching element, and a first electrode of the fourth switching element are electrically connected to a same node;

a first electrode and a control electrode of the first switching element are respectively configured to be electrically connected with a reset level signal terminal and a bias level signal terminal;

a first electrode and a control electrode of the third switching element are configured to be electrically connected with a level input terminal;

a second electrode and a control electrode of the fourth switching element are respectively configured to be electrically connected with a level output terminal and a drive level signal terminal; and a second electrode of the second switching element and a second terminal of the energy storage element are configured to be electrically connected with a reference level terminal.

13. The ultrasonic sensing device according to claim 11, further comprising an array substrate,
wherein the pixel circuit is integrated in the array substrate; the array substrate is on a side of the emission electrode layer facing away from the piezoelectric layer; and
the input terminal of the pixel circuit is electrically connected with the receiving electrode through a wire penetrating the insulating layer.

14. A display device, comprising an ultrasonic sensing device, wherein the ultrasonic sensing device comprises an actuating signal transmitting circuit, a pixel circuit and an ultrasonic sensing module,
wherein the ultrasonic sensing module comprises a first electrode layer, a piezoelectric layer, a receiving electrode layer and an emission electrode layer;
the first electrode layer is disposed on a first side of the piezoelectric layer;
the receiving electrode layer and the emission electrode layer insulated from the receiving electrode layer are on a second side of the piezoelectric layer; the second side of the piezoelectric layer is opposite to the first side of the piezoelectric layer;
the ultrasonic sensing module further comprises an insulating layer between the receiving electrode layer and the emission electrode layer;

the emission electrode layer comprises a plurality of emission electrodes which are separated from each other; each of the plurality of emission electrodes is configured to form an emission electrode pair with the first electrode layer;

the receiving electrode layer comprises a plurality of receiving electrodes which are separated from each of other; each of the plurality of receiving electrodes is configured to form a receiving electrode pair with the first electrode layer; and an output terminal of the actuating signal transmitting circuit is electrically connected with the emission electrode of the ultrasonic sensing module; and an input terminal of the pixel circuit is electrically connected with the receiving electrode of the ultrasonic sensing module.

15. The display device according to claim 14, further comprising a display panel,
wherein the ultrasonic sensing device further comprises an array substrate; the pixel circuit is integrated in the array substrate; the array substrate is on a side of the emission electrode layer facing away from the piezoelectric layer;
the input terminal of the pixel circuit is electrically connected with the receiving electrode through a wire penetrating the insulating layer; and
a side of the array substrate of the ultrasonic sensing device facing away from the insulating layer contacts the display panel.

16. The display device according to claim 14, further comprising a protective cover,
wherein the ultrasonic sensing device further comprises an array substrate; the pixel circuit is integrated in the array substrate; the array substrate is on a side of the emission electrode layer facing away from the piezoelectric layer;
the input terminal of the pixel circuit is electrically connected with the receiving electrode through a wire penetrating the insulating layer; and
a side of the array substrate of the ultrasonic sensing device facing away from the insulating layer contacts the protective cover.

* * * * *